United States Patent
Ma

(10) Patent No.: US 10,642,388 B2
(45) Date of Patent: May 5, 2020

(54) PROTECTIVE COVER OF TOUCH KEY STRUCTURE, METHOD OF FABRICATION THEREOF, AND TOUCH PANEL WITH COVERED TOUCH KEY STRUCTURE

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventor: Xian-Jun Ma, Shenzhen (CN)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

( * ) Notice: Subject to any disclaimer, the term of this patent is extended or adjusted under 35 U.S.C. 154(b) by 0 days.

(21) Appl. No.: 16/039,009

(22) Filed: Jul. 18, 2018

(65) Prior Publication Data
US 2019/0204943 A1  Jul. 4, 2019

(30) Foreign Application Priority Data
Dec. 29, 2017  (CN) .......................... 2017 1 1473740

(51) Int. Cl.
| | |
|---|---|
| *G06F 3/041* | (2006.01) |
| *B32B 7/12* | (2006.01) |
| *G06F 1/16* | (2006.01) |
| *G06F 3/01* | (2006.01) |
| *H03K 17/96* | (2006.01) |

(52) U.S. Cl.
CPC ............... *G06F 3/041* (2013.01); *B32B 7/12* (2013.01); *G06F 1/169* (2013.01); *G06F 3/016* (2013.01); *H03K 17/96* (2013.01); *G06F 2203/04103* (2013.01)

(58) Field of Classification Search
CPC ...... G06F 1/1626; G06F 3/044; G06F 1/1656; G06F 2200/1633; G06F 1/1684; G06F 3/0202; G06F 3/03547; G06F 3/041; G06F 3/0488; G06F 3/0412; G06F 3/04886; G06F 1/1633; G06F 1/169; G06F 2203/04103; H04B 1/3888; H04B 2001/3894; A45C 13/002; A45C 13/36; B65D 81/02; H05K 5/02; H05K 5/03; B32B 7/12
See application file for complete search history.

(56) References Cited

U.S. PATENT DOCUMENTS

| | | | |
|---|---|---|---|
| 8,547,695 B2 * | 10/2013 | Schroeder | ............... B23P 11/00 248/176.3 |
| 9,072,351 B2 * | 7/2015 | Schroeder | ............... B23P 11/00 |
| 9,788,620 B1 * | 10/2017 | Parkinson | ............... A45C 11/00 |

(Continued)

*Primary Examiner* — Michael J Jansen, II
(74) *Attorney, Agent, or Firm* — ScienBiziP, P.C.

(57) ABSTRACT

A protective cover for a touch panel comprises a cover and an adhesive layer formed on a surface of the cover. The protective cover is bulge-shaped, and defines a plurality of gaps. The gaps are regularly spaced from each other. The gaps are located at a joint between the top portion and the connection portion and at a joint between the connection portion and the wing portion. The gap reduces a springback phenomenon of the connection portion after being curved.

17 Claims, 5 Drawing Sheets

(56) References Cited

U.S. PATENT DOCUMENTS

| | | | | |
|---|---|---|---|---|
| 10,088,936 B2* | 10/2018 | Zellers | ............... | G06F 3/0414 |
| 10,146,261 B2* | 12/2018 | Hashimoto | ............ | G02F 1/167 |
| 10,353,485 B1* | 7/2019 | Zhang | ............... | G06F 3/021 |
| 10,437,393 B2* | 10/2019 | Liu | ............... | G06F 1/1626 |
| 2012/0097510 A1* | 4/2012 | Mitchell | ............ | H01H 13/705 |
| | | | | 200/333 |
| 2013/0155610 A1* | 6/2013 | Schroeder | ............ | B23P 11/00 |
| | | | | 361/679.58 |
| 2014/0027323 A1* | 1/2014 | Schroeder | ............ | B23P 11/00 |
| | | | | 206/223 |
| 2014/0190814 A1* | 7/2014 | Wu | ............ | G06F 1/16 |
| | | | | 200/600 |
| 2014/0191973 A1* | 7/2014 | Zellers | ............ | G06F 3/0414 |
| | | | | 345/168 |
| 2015/0104609 A1* | 4/2015 | Chiang | ............ | G06F 1/169 |
| | | | | 428/138 |
| 2015/0301655 A1* | 10/2015 | Liu | ............ | G06F 1/1613 |
| | | | | 345/174 |
| 2015/0370406 A1* | 12/2015 | Zhao | ............ | B32B 9/00 |
| | | | | 345/174 |
| 2018/0039303 A1* | 2/2018 | Hashimoto | ............ | G02F 1/167 |
| 2019/0204943 A1* | 7/2019 | Ma | ............ | G06F 3/041 |

* cited by examiner

PROTECTIVE COVER OF TOUCH KEY STRUCTURE, METHOD OF FABRICATION THEREOF, AND TOUCH PANEL WITH COVERED TOUCH KEY STRUCTURE

FIELD

The present disclosure relates to a protective cover of touch display devices.

BACKGROUND

A touch display apparatus can include a casing, a touch panel, a display panel below the touch panel, and at least one touchable key. The touch panel and the display are received in the casing. The touch key can be a thin film type touch key, and include a key structure and an elastic member. The elastic pad is mounted on the touch panel, and can generate feedback as a tactile push-back when pressed. The elastic member can be easily damaged during the fabrication and fitting process, and the vulnerability of such member can be improved.

Therefore, there is room for improvement within the art.

BRIEF DESCRIPTION OF THE FIGURES

Implementations of the present technology will now be described, by way of example only, with reference to the attached figures.

DETAILED DESCRIPTION

Figure 1:
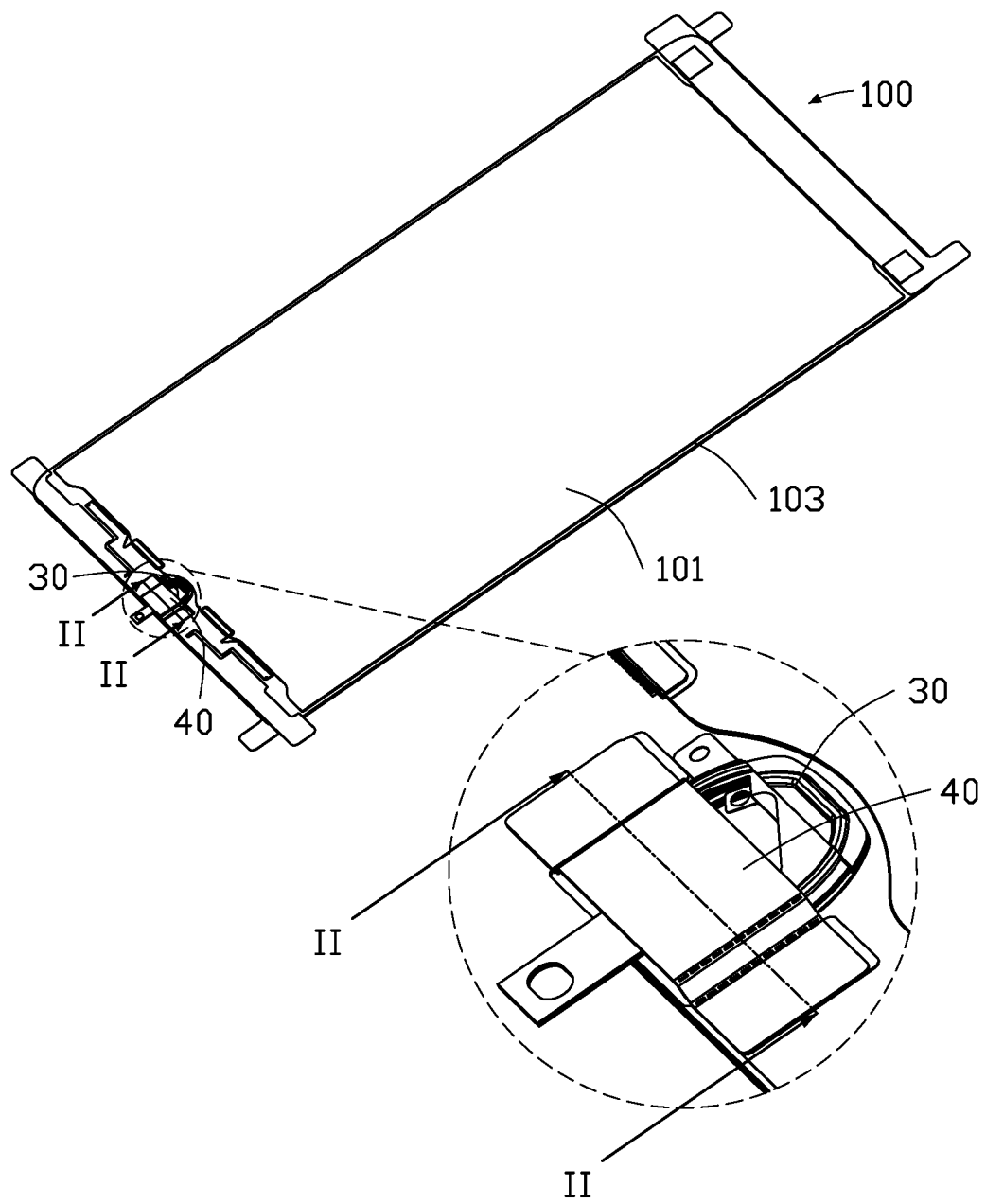
FIG. 1 is a view of an embodiment of a touch panel, with one part circled and enlarged, the touch panel comprises a protective cover.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one".

The present disclosure provides a touch panel with a protective cover. The cover is capable of being used in any type of touch panel having touch key(s), such as touch panel used in tablet computer. The protective cover includes a cover and an adhesive layer pasted on an inner surface of the cover. The cover includes a top portion, two wing portions, and two connection portions. The connection portions are curved from opposite ends of the top portion to the inner surface of the top portion, and curved towards one side of the top portion. Each wing portion extends from an end of each connection portion away from the top portion, and is parallel with the top portion. The protective cover defines a plurality of gaps. The gaps are located at a joint between the top portion and the connection portion and at a joint between the connection portion and the wing portion.

FIG. 1 illustrates an embodiment of the touch panel 100. The touch panel 100 includes a touch substrate 20 and a touch key structure 30. The touch panel 100 defines a display region 101 and a non-display region 103 surrounding the display region 101. The display region 101 is substantially square or rectangular in shape. The touch substrate 20 is located in the display region 101, and extends into the non-display region 103. The touch substrate 20 can further include at least one touch electrode layer for sensing touch operation, a passive layer for insulating the touch electrode layer, and a pressure sensing layer for sensing a pressure of the touch operation, and so on. The touch key structure 30 in the non-display region 103 cooperates with a key module (now shown) on the display panel (not shown) to form keys on a thin touchable film.

The touch key structure 30 is disposed on the touch substrate 20. The touch key structure 30 is an elastic element, and deforms to provide a tactile feedback. In the embodiment, the touch key structure 30 is an elastic pad, and is made of elastic material, such as rubber. The touch key structure 30 is substantially circular.

The touch panel 100 further includes a protective cover 40 before assembling with the display panel. The protection cap 40 protects the touch key structure 30 from damage. The protective cover 40 covers the touch key structure 30, and is pasted on a surface of the touch substrate 20.

Figure 2:
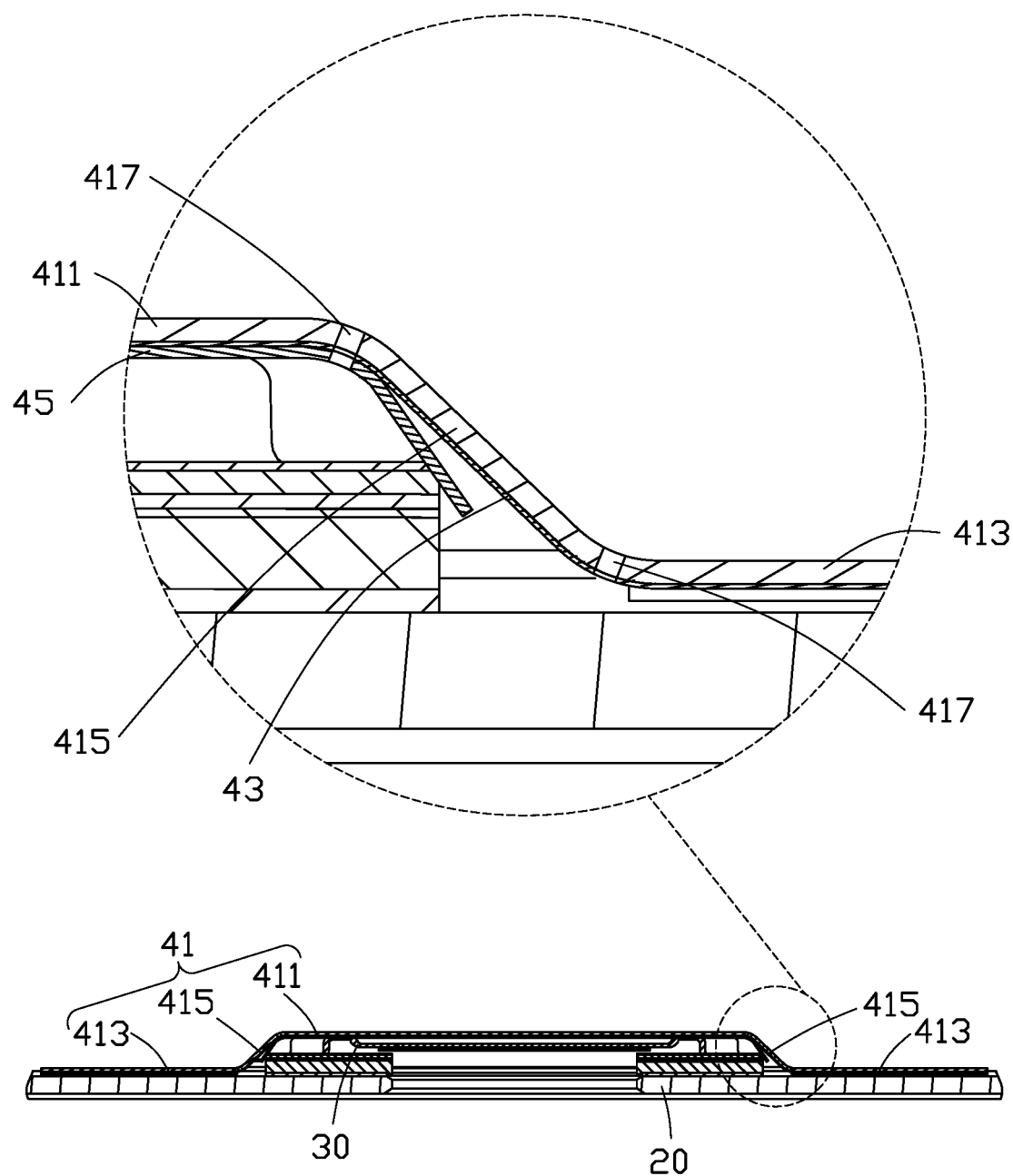
FIG. 2 is a cross-sectional view of the touch panel of FIG. 1 taken along a line II-II thereof, with one part circled and enlarged.

FIG. 2 illustrates a cross-sectional view of the protective cover 40. The protective cover 40 includes a cover 41, an adhesive layer 43, and a protection layer 45, which are stacked in that order.

The cover 41 is substantially bulge-shape. The cover 41 includes a top portion 411, two wing portions 413, and two connection portions 415. In this embodiment, the top portion 411 is substantially rectangular. The top portion 411 is disposed on the touch key structure 30. The top portion 411 is parallel with the touch substrate 20, and is perpendicularly spaced from the touch key structure 30. The connection portions 415 are symmetrically located on opposite sides of the top portion 411. Each connection portion 415 extends from an end of the top portion 411, and curves towards one side of the top portion adjacent to the touch substrate 20. Each wing portion 413 extends from an end of one of the connection portion 415 away from the top portion 411, and is parallel with the top portion 411. The wing portions 413 are disposed on opposite sides of the top portion 411, and provide pasting regions for pasting the top portion 411 on the touch substrate 20. The connection portions 415 are obtusely angled from the top portion 411, and are acutely angled from the touch substrate 20. The obtuse angle is in a range from 130 to 136 degrees. In the embodiment, the cover 41 is fabricated by the stamping of a convex mould. In this embodiment, a thickness of the cover 41 is 0.05 millimeter (mm).

Figure 3:
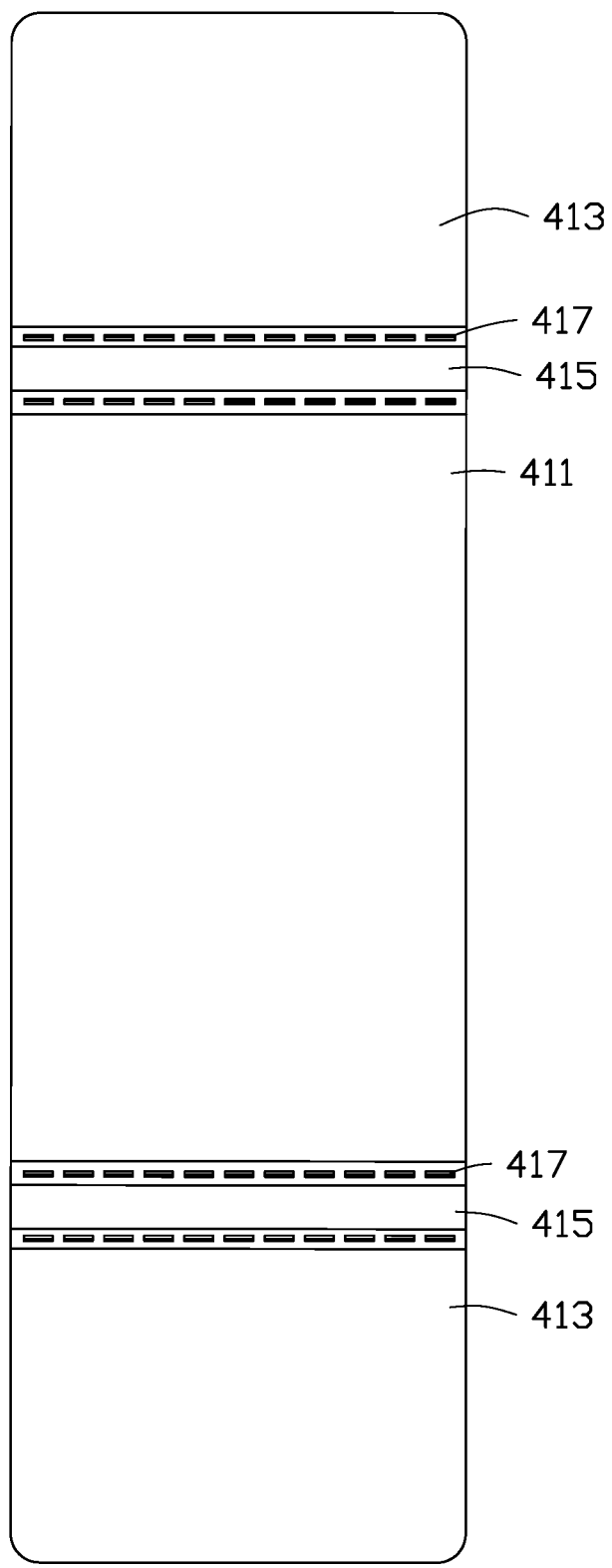
FIG. 3 is a planar view of the protective cover of FIG. 1.

The cover 41 further defines a plurality of gaps 417. The gaps 417 are located at a joint between the top portion 411 and the connection portion 415, and at a joint between the connection portion 415 and the wing portion 413. In the embodiment, the gaps 417 are regularly spaced from each other. The gaps 417 at the same joint are aligned in a line along a first direction (as shown in FIG. 3). The first direction is an extending direction of a line where the connection portion 415 curves from the top portion 411. The gap 417 reduces a springback phenomenon of the connection portion 415 after being curved. In the embodiment, the first direction is a width way direction of the top portion 411. A width of the gap 417 along a second direction perpendicular to the first direction is 0.5 mm. In other embodiments, the width of the gap 417 along the second direction can be adjusted.

The adhesive layer 43 is located between the cover 41 and the protection layer 45. The adhesive layer 43 is pasted on an inner surface of the cover 41 facing the touch key structure 30, and is used for pasting the cover 41 on the touch substrate 20. In the embodiment, the adhesive layer 43 covers the whole inner layer of the cover 41. The protection layer 45 covers a surface of the adhesive layer 43 away from the cover 41. The protection layer 45 only covers the adhesive layer 43 on the top region 411 and the adhesive layer 43 covers only a part of each connection portion 415. The adhesive layer 43 at the wing portions 413 is exposed from the protection layer 45. The protection layer 45 protects the adhesive layer 43 in the top portion 411 and a part of each connection portion 415 from being damaged while being curved during the fabricating process. The protection layer 45 is made of plastic material, such as Polyethylene terephthalate (PET). In the embodiment, a thickness of the protection layer 45 is 0.05 mm. In the other embodiments, the thickness of the protection layer 45 is different from the thickness of the cover 41. Perfectly, the thickness of the cover 41 is thicker than the thickness of the protection layer 45.

The gaps 417 located at the joint between the top region 411 and the connection region 415 pass through the whole cover 41, the adhesive layer 43, and the protection layer 45. The gaps 417 located at the joint between the connection region 415 and the wing region 413 pass through the whole cover 41 and the adhesive layer 43.

When assembling the touch panel 100 with the display panel, the protective cover 40 is removed, and the surface of the touch substrate 20 facing the protective cover 40 is mounted on the key module of the display panel. Thereby, a film type touch key is formed.

Based on the structure of touch panel 100, the protective cover 40 protects the touch key structure 30 before the assembling process, and the protection layer 45 protects the adhesive layer 43 from falling off during the fabricating process. The gaps 417 reduce a springback phenomenon of the connection portion 415 after being curved. Thus, the touch panel 100 is completed in function.

Figure 4:
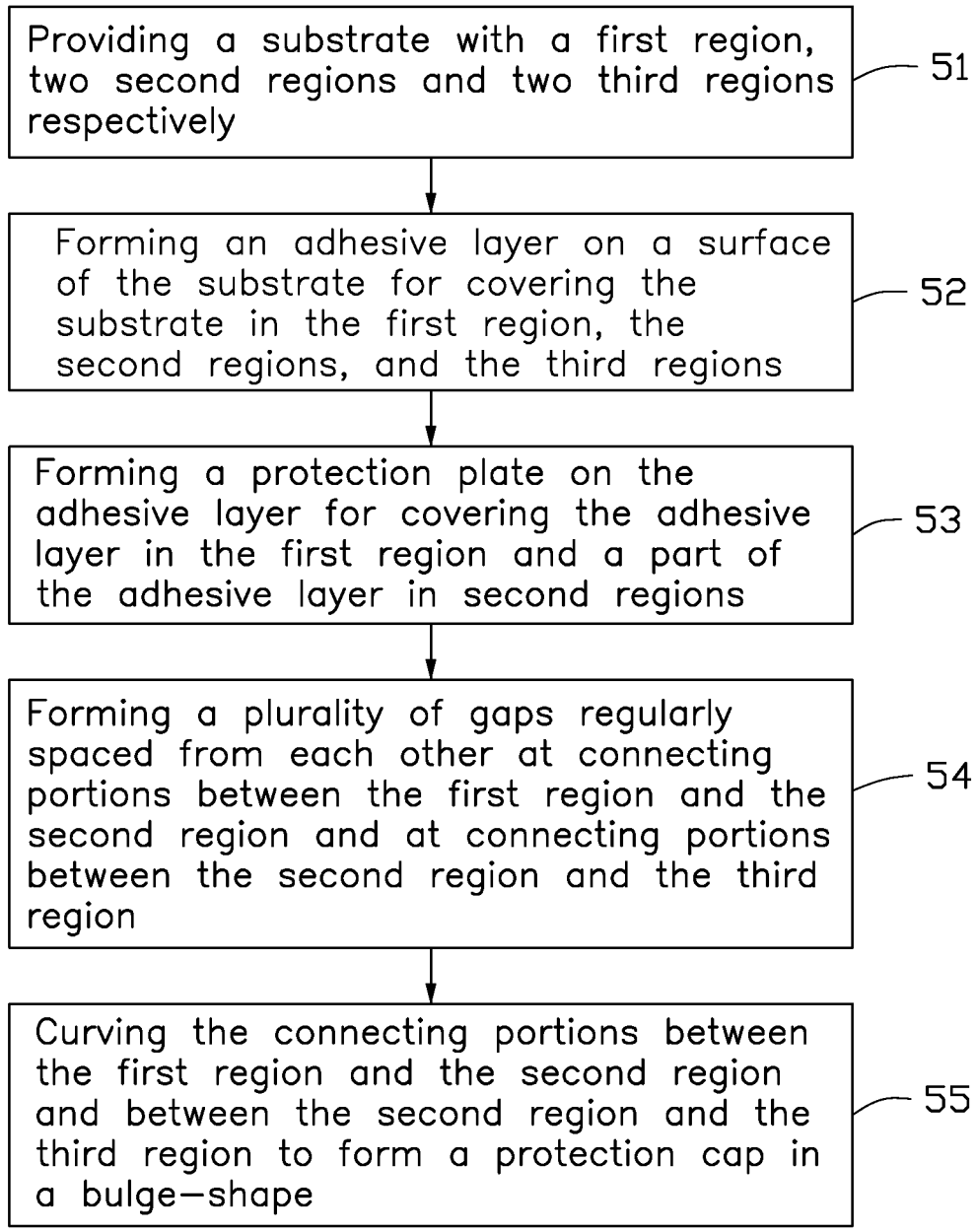
FIG. 4 is a flowchart of an embodiment of a method for fabricating the protective cover of FIG. 1.

FIG. 4 is a flowchart of a method for fabricating the protective cover 40 of the touch panel 100 in accordance with an example embodiment. The method for fabricating the protective cover 40 of the touch panel 100 is provided by way of example, as there are a variety of ways to carry out the method. The method described below can be carried out using the configurations illustrated in FIGS. 1-3, for example, and various elements of these figures are referenced in explaining the method. Each block shown in FIG. 4 represents one or more processes, methods or subroutines, carried out in the method. Additionally, the illustrated order of blocks is by example only and the order of the blocks can change. The method can begin at block 51.

Figure 5:
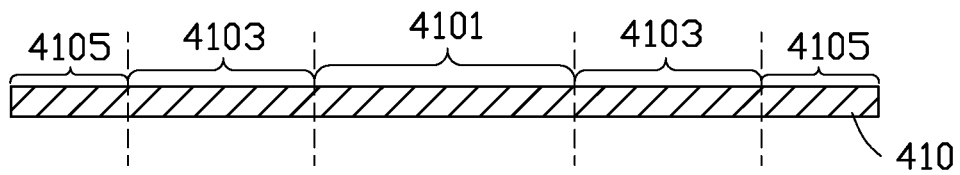
FIGS. 5-9 are views to correspond with the blocks 51-54 shown in FIG. 4.

In block 51, a substrate 410 is provided. Referring also to FIG. 5, the substrate 410 defines a first region 4101 at the middle of the substrate 410, two second regions 4103 adjacent to the first region 4101, and two third regions 4105 adjacent to the second regions 4103 respectively. The second regions 4103 are symmetrically located on opposite sides of the first region 4101. The third regions 4105 are symmetrically located on opposite sides of the first region 4101. Each second region 4103 is between the first region 4101 and the third region 4105. In a side of the first region 4101, there are one second region 4103 and one third region 4105. In this embodiment, the substrate 410 is made of Polythlene terephthalate (PET) material.

Figure 6:
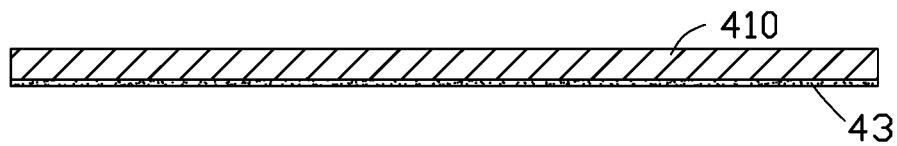

In block 52, an adhesive layer 43 is formed on a surface of the substrate 410 for covering the substrate 410 in the first region 4101, the second regions 4103, and the third regions 4105. Referring to FIG. 6, the adhesive layer 43 located on an inner surface of the substrate 410 covers the first region 4101, the second regions 4103, and the third regions 4105.

Figure 7:
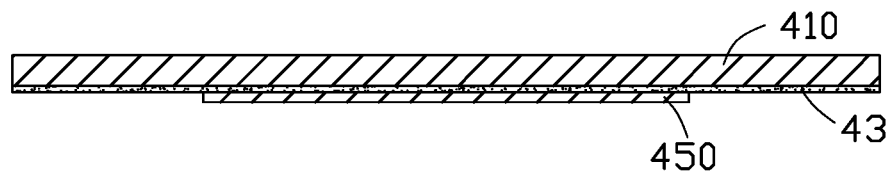

In block 53, a protection plate 450 is formed on the adhesive layer 43 for covering the adhesive layer 43 in the first region 4101 and a part of the adhesive layer 43 in the second regions 4103. Referring to FIG. 7, the protection plate 450 protects the adhesive layer 43 in the first region 4101 and in a part of each second region 4103 from being damaged during a curving fabricating process.

Figure 8:
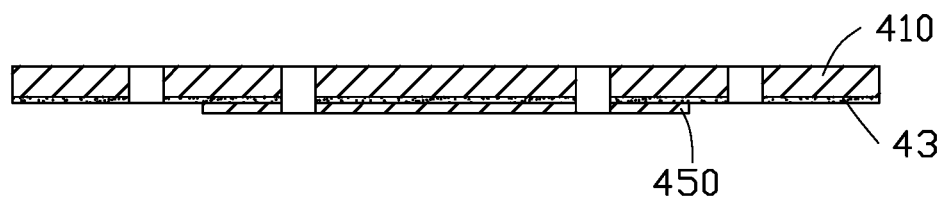

In block 54, a plurality of gaps 417 regularly spaced from each other are defined at connecting portions between the first region 4101 and the second region 4103, and at connecting portions between the second region 4103 and the third region 4105. Referring to FIG. 8, the gaps 417 located at the connecting portion between the first region 4101 and the second region 4103 pass through the substrate 410, the adhesive layer 43, and the protection plate 450. The gaps 417 located at the connecting portion between the second region 4103 and the third regions 4105 pass through the substrate 410 and the adhesive layer 43. In the embodiment, the gaps 417 at the same connection portion are aligned in a line along a first direction. The first direction is an extending direction of a line. The gap 417 reduces a springback phenomenon of the connection portion 415 after being curved.

Figure 9:
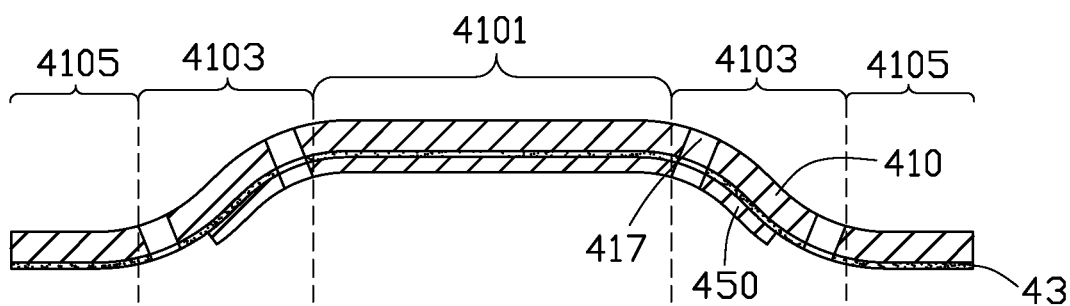

In block 54, the connecting portions are curved to form a protective cover 40 in a bulge-shape. Referring to FIG. 9, the first region 4101 is served as the top portion 411, the second region 4103 are served as the connection portion 415, and the third regions 4105 are severed as the wing portion 413, thus a protective cover 40 is achieved. In this embodiment, the connecting portions are formed by a convex mold.

Based on the method, the protection layer 45 protects the adhesive layer 43 from falling off during the curving fabricating process. The gaps 417 reduce a springback phenomenon of the connection portion 415 after being curved. Thus, the touch panel 100 is completed in function.

While various and preferred embodiments have been described the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A protective cover for protecting a touch key structure of a touch panel, the protective cover comprising:
   a cover; and
   an adhesive layer formed on a surface of the cover, and configured to bond the cover on the touch panel;
   wherein the cover comprises a top portion, two wing portions, and two connection portions; the connection portions respectively extend from two opposite ends of the top portion and curve towards a same side of the top portion; each wing portion extends from an end of one of the connection portions away from the top portion, and is parallel with the top portion; the protective cover defines a plurality of gaps; the gaps are regularly spaced from each other; the gaps are located at a joint between the top portion and the connection portion and at a joint between the connection portion and the wing portion; the gap reduces a springback phenomenon of the connection portion after being curved.

2. The protective cover of claim 1, wherein the gaps at the same joint are aligned in a line along a first direction, the first direction is an extending direction of a line where the connection portion curves.

3. The protective cover of claim 1, wherein a width of the gap along a second direction perpendicular to the first direction is 0.5 mm.

4. The protective cover of claim 1, wherein the protective cover further comprises a protection layer; the protection layer is pasted on a surface of the adhesive layer away from the cover; the protection layer covers the adhesive layer on the top region and on a part of each connection portion; the wing portion are exposed from the protection; the protection layer protects the adhesive layer in the top portion and in a part of each connection portion from being damaged during a curving fabricating process.

5. The protective cover of claim 4, wherein a thickness of each of the cover and the protection layer is 0.05 mm.

6. The protective cover of claim 4, wherein the gaps at a joint between the top portion and the connection portion pass through the cover, the adhesive layer, and the protection.

7. The protective cover of claim 4, wherein the gaps at a joint between the connection portion and the wing portion pass through the cover and the adhesive layer.

8. A touch panel comprising:
   a touch key structure configured to provide a tactile feedback; and
   a protective cover located on the touch key structure, and configured to protect the touch key structure, the protective cover comprising:
   a cover;
   an adhesive layer formed on a surface of the cover, and configured to paste the cover on the touch panel; and
   a protection layer formed on a surface of the adhesive layer away from the cover;
   wherein the cover comprises a top portion, two wing portions, and two connection portions; the connection portions respectively extends from two opposite ends of the top portion, and curve towards a same side of the top portion; each wing portion extends from an end of one of the connection portions away from the top portion, and is parallel with the top portion; the protection layer is pasted on a surface of the adhesive layer away from the cover; the protection layer covers the adhesive layer on the top region and on a part of each connection portion; the wing portions are exposed from the protection; the protection layer protects the adhesive layer in the top portion and in a part of each connection portion from damage during a curving fabrication process.

9. The touch panel of claim 8, wherein a thickness of each of the cover and the protection layer is 0.05 mm.

10. The touch panel of claim 8, wherein the protective cover defines a plurality of gaps; the gaps are regularly spaced from each other; the gaps are located at a joint between the top portion and the connection portion and at a joint between the connection portion and the wing portion; the gap reduces a springback phenomenon of the connection portion after being curved.

11. The touch panel of claim 10, wherein the gaps at the same joint are aligned in a line along a first direction, the first direction is an extending direction of a line where the connection portion curves.

12. The touch panel of claim 10, wherein a width of the gap along a second direction perpendicular to the first direction is 0.5 mm.

13. The touch panel of claim 10, wherein the gaps at a joint between the top portion and the connection portion pass through the cover, the adhesive layer, and the protection layer; the gaps at a joint between the connection portion and the wing portion pass through the cover and the adhesive layer.

14. A fabricating method for forming a protective cover of a touch panel; the method comprising:
   providing a substrate with a first region, two second regions adjacent to the first region, and two third regions adjacent to the second regions respectively;
   forming an adhesive layer on a surface of the substrate for covering the substrate in the first region, the second regions, and the third regions;
   forming a protection plate on the adhesive layer for covering the adhesive layer in the first region and a part of the adhesive layer in second regions; and
   curving a connecting portion between the first region and the second region and a connecting portion between the second region and the third region to form a protective cover in a bulge-shape;
   forming a plurality of gaps regularly spaced from each other at connecting portions between the first region and the second region and at connecting portions between the second region and the third region.

15. The fabricating method of claim 14, wherein the gaps at the same connecting portion are aligned in a line along a first direction, the first direction is an extending direction of a line where the connection portion curves.

16. The fabricating method of claim 15, wherein a width of the gap along a second direction perpendicular to the first direction is 0.5 mm.

17. The fabricating method of claim 15, wherein the gaps at the connecting portion between the first region and the second region pass through the cover, the adhesive layer, and the protection; the gaps at the connecting portion between the second region portion and the third region pass through the cover and the adhesive layer.

* * * * *